United States Patent
Choi et al.

(10) Patent No.: US 10,229,828 B2
(45) Date of Patent: Mar. 12, 2019

(54) METHOD OF TREATING SEMICONDUCTOR SUBSTRATE

(71) Applicant: SK hynix Inc., Icheon (KR)

(72) Inventors: Yong Soo Choi, Seongnam (KR); Ho Jin Jeong, Suwon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/584,637

(22) Filed: May 2, 2017

(65) Prior Publication Data

US 2018/0076022 A1     Mar. 15, 2018

(30) Foreign Application Priority Data

Sep. 13, 2016    (KR) ........................ 10-2016-0118412

(51) Int. Cl.
| | |
|---|---|
| H01L 21/02 | (2006.01) |
| H01L 21/447 | (2006.01) |
| H01L 21/306 | (2006.01) |
| B81C 1/00 | (2006.01) |
| H01L 21/3065 | (2006.01) |

(52) U.S. Cl.
CPC .. *H01L 21/02164* (2013.01); *H01L 21/02019* (2013.01); *H01L 21/02052* (2013.01); *H01L 21/02112* (2013.01); *H01L 21/02403* (2013.01); *H01L 21/447* (2013.01); *B81C 1/00952* (2013.01); *H01L 21/0206* (2013.01); *H01L 21/0223* (2013.01); *H01L 21/02063* (2013.01); *H01L 21/02172* (2013.01); *H01L 21/02255* (2013.01); *H01L 21/3065* (2013.01); *H01L 21/30625* (2013.01)

(58) Field of Classification Search
CPC ......... H01L 21/02164; H01L 21/02403; H01L 21/02052; H01L 21/02019; H01L 21/02112; H01L 21/447; H01L 21/3065; H01L 21/30625; H01L 21/0206; H01L 21/02172; H01L 21/02063; H01L 21/02255; H01L 21/0223; B81C 1/00952
See application file for complete search history.

(56) References Cited

U.S. PATENT DOCUMENTS

| | | | |
|---|---|---|---|
| 9,090,782 B2 * | 7/2015 | Saio | .................. H01L 21/02057 |
| 2004/0224537 A1 * | 11/2004 | Lee | ...................... C09D 183/16 |
| | | | 438/782 |
| 2005/0214695 A1 * | 9/2005 | Kato | .................... H01L 21/0275 |
| | | | 430/324 |
| 2006/0003596 A1 * | 1/2006 | Fucsko | .................. H01L 21/316 |
| | | | 438/758 |
| 2009/0311874 A1 * | 12/2009 | Tomita | .............. H01L 21/02057 |
| | | | 438/759 |

(Continued)

*Primary Examiner* — Anita K Alanko

(57) ABSTRACT

In a method of treating a semiconductor substrate, a plurality of active regions and a plurality of trench isolation regions are formed by selectively etching the semiconductor substrate. The semiconductor substrate is washed by providing deionized water to the semiconductor substrate. A silicon-based solution is provided to the semiconductor substrate by replacing the deionized water disposed on the semiconductor substrate with the silicon-based solution. A silicon oxide material is formed from the silicon-based solution by performing a heat treatment on the silicon-based solution and the semiconductor substrate. The silicon oxide material fills the trench isolation regions.

18 Claims, 13 Drawing Sheets

(56) References Cited

U.S. PATENT DOCUMENTS

2012/0094493 A1\* 4/2012 Hizawa ............ H01L 21/02222
 438/694
2015/0125791 A1 5/2015 Somervell et al.

\* cited by examiner

METHOD OF TREATING SEMICONDUCTOR SUBSTRATE

CROSS-REFERENCE TO RELATED APPLICATION

The present application claims priority under 35 U.S.C. 119(a) to Korean Patent Application No. 10-2016-0118412, filed on Sep. 13, 2016, which is herein incorporated by reference in its entirety.

BACKGROUND

1. Technical Field

Various embodiments of the present disclosure generally relate to a method of treating a semiconductor substrate.

2. Related Art

A semiconductor device manufacturing process may proceed by performing a variety of treatments with respect to a semiconductor substrate, so that a plurality of electrical devices and interconnections for connecting the electrical devices can be sequentially stacked on the semiconductor substrate. The method of treating the semiconductor substrate may include a photolithography process, an etching process, a cleaning process, a thin film depositing process, and a doping process.

According to development trends of semiconductor technology, critical dimensions of electrical devices and interconnections formed on a semiconductor substrate have been continuously reduced. Accordingly, performing the above-described method of treating a semiconductor substrate has become increasingly difficult.

SUMMARY

Various embodiments are directed to a method of treating a semiconductor substrate, which can ensure the structural stability of a pattern structure formed on the semiconductor substrate when the pattern structure has a high aspect ratio.

According to an embodiment, there is provided a method of treating a semiconductor substrate. In the method of treating a semiconductor substrate according to an embodiment, a plurality of active regions and a plurality of trench isolation regions are formed by selectively etching the semiconductor substrate. The plurality of active regions are formed in the semiconductor substrate, and the plurality of trench isolation regions are formed between the plurality of active regions. The semiconductor substrate is washed by providing deionized water to the semiconductor substrate. The provided deionized water is disposed on the semiconductor substrate. A silicon-based solution is provided to the semiconductor substrate by replacing the deionized water disposed on the semiconductor substrate with the silicon-based solution. The silicon-based solution covers the plurality of active regions and fills the plurality of trench isolation regions. A silicon oxide material is formed from the silicon-based solution by performing a heat treatment on the silicon-based solution and the semiconductor substrate. The silicon oxide material fills the trench isolation regions.

According to an embodiment, a semiconductor structure is washed by providing deionized water to the semiconductor structure. The semiconductor structure includes a semiconductor substrate and a plurality of pattern structures, and the plurality of pattern structures are spaced apart from each other. An insulation treatment solution is provided to the semiconductor structure by replacing the deionized water which is provided to the semiconductor structure with the insulation treatment solution. An insulation material is formed from the insulation treatment solution by performing a heat treatment on the insulation treatment solution and the semiconductor structure. The insulation material is formed over the plurality of pattern structures.

BRIEF DESCRIPTION OF THE DRAWINGS

Various embodiments of the disclosure will become more apparent in view of the attached drawings and accompanying detailed description, in which.

DETAILED DESCRIPTION OF THE EMBODIMENTS

Figure 1:
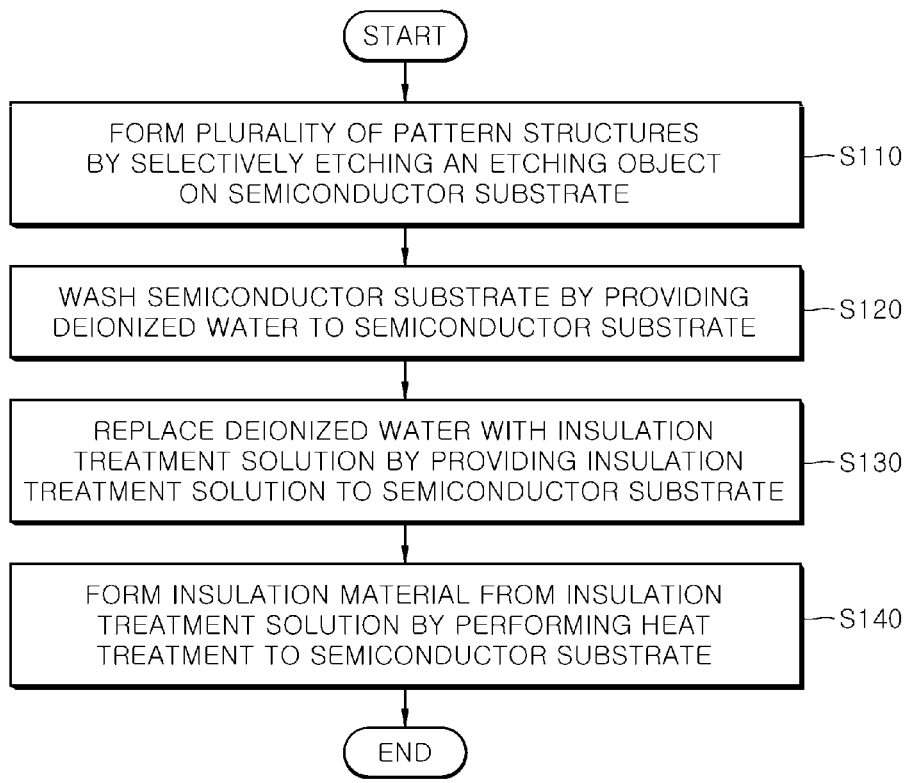
FIG. 1 is a flow chart schematically illustrating a method of treating a semiconductor substrate according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a flow chart schematically illustrating a method of treating a semiconductor substrate according to an embodiment of the present disclosure.

Referring to FIG. 1, in operation S110, a plurality of pattern structures are formed by selectively etching an etching object. The etching object may be part of a semiconductor substrate or part of a layer stacked on a semiconductor substrate. The plurality of pattern structures may be spaced apart from each other and arranged along a predetermined direction on the semiconductor substrate. In an embodiment, the plurality of pattern structures may be active regions formed in the semiconductor substrate. In another embodiment, the plurality of pattern structures may be pillar-shaped structures formed on the semiconductor substrate.

In operation S120, deionized water is provided to the semiconductor substrate, which has been selectively etched, to wash the semiconductor substrate. Before washing the semiconductor substrate, at least one of a dry etching process and a wet etching process may be performed to remove byproducts generated during the etching process performed in operation S110.

In operation S130, the deionized water is replaced with an insulation treatment solution by providing the insulation treatment solution to the semiconductor substrate. The insulation treatment solution may be provided to the semiconductor substrate while the deionized water at least partially fills spaces between the plurality of the pattern structures.

The insulation treatment solution may include a solute, which includes a material that can be oxidized. The insulation treatment solution may include an organic solvent or an inorganic solvent, which dissolves the solute. For example, the solute may include silicon or a metal that can be oxidized. The insulation treatment solution may be, for example, a silicon-based solution.

The specific gravity of the insulation treatment solution may be greater than the specific gravity of the deionized water. The process of replacing the deionized water with the insulation treatment solution may be performed due to a difference between the specific gravity of the insulation treatment solution and the specific gravity of the deionized water. Specifically, the insulation treatment solution, which has a relatively great specific gravity, sinks underneath the deionized water, and the deionized water, which has a relatively small specific gravity, rises above the insulation treatment solution. Accordingly, the deionized water can be replaced with the insulation treatment solution. As a result, the insulation treatment solution can contact the pattern structures when the insulation treatment solution replaces the deionized water.

In operation S140, an insulation material layer is formed on the semiconductor substrate by performing a heat treatment process on the insulation treatment solution and the semiconductor substrate. The insulation material layer may be formed between the plurality of pattern structures. The insulation material layer may fill the spaces between the plurality of pattern structures.

In a specific embodiment, the heat treatment process may proceed as follows. First, the semiconductor substrate is dried to remove the deionized water, which has been replaced with the insulation treatment solution, from the semiconductor substrate. Subsequently, a heat treatment is performed on the semiconductor substrate in the presence of oxygen. The heat treatment removes the solvent in the insulation treatment solution, and oxidizes the solute in the insulation treatment solution, and thereby forms an oxide material. That is, the heat treatment may cause the solvent to evaporate, and cause the ambient oxygen to oxidize the solute.

By performing the above-described processes, the method of treating a semiconductor substrate according to an embodiment of the present disclosure can be implemented.

FIGS. 2 to 7 are cross-sectional views schematically illustrating a method of treating a semiconductor substrate according to an embodiment of the present disclosure. The method of treating a semiconductor substrate illustrated in FIGS. 2 to 7 may be applied in a process of forming a device isolation layer in a semiconductor memory cell.

Figure 2:
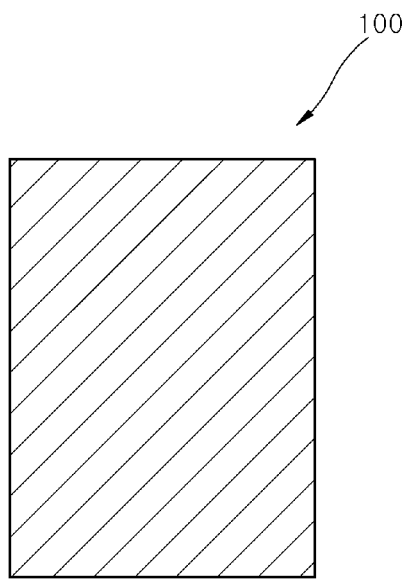
FIGS. 2 to 7 are cross-sectional views schematically illustrating a method of treating a semiconductor substrate according to an embodiment of the present disclosure.

Referring to FIG. 2, a semiconductor substrate 100 is provided. The semiconductor substrate 100 may be formed of a material, such as silicon (Si), germanium (Ge), gallium arsenide (GaAs), or the like, but is not limited thereto. The semiconductor substrate 100 may be formed of any of various known materials capable of being processed by a semiconductor integrated circuit. That is, the semiconductor substrate 100 may include a material that can be processed using a method for fabricating a semiconductor-based integrated circuit.

Figure 3:
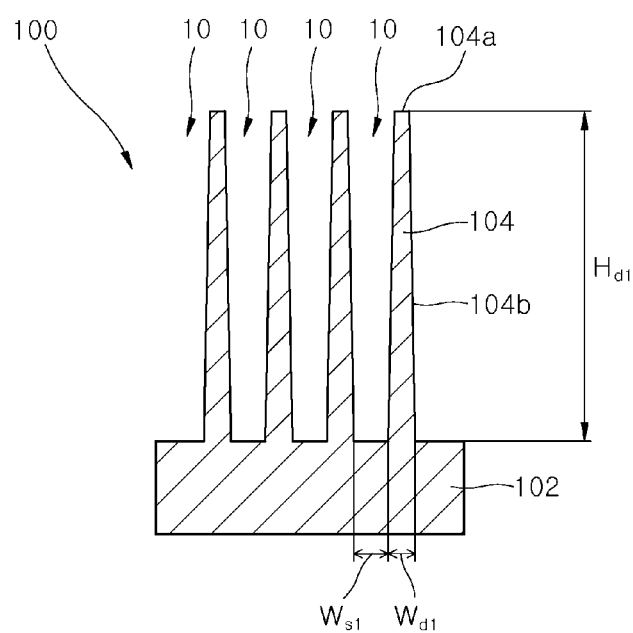

Referring to FIG. 3, the semiconductor substrate 100 is selectively etched to form a plurality of pattern structures or active regions 104 in the semiconductor substrate 100. Each of the active regions 104 may include a structure, such as a pillar structure. The semiconductor substrate 100 and the pattern structures or active regions 104 may be collectively referred to as a "semiconductor structure." A plurality of trench isolation regions 10, which include trenches formed by the etching process, may be disposed between the active regions 104. A bulk region 102 may not be processed with the etching process, and may be disposed below the active regions 104 and the trench isolation regions 10. The bulk region 102 corresponds to a portion of the semiconductor substrate 100 that remains after the etching process.

In a specific embodiment, the etching process may be performed as follows. Although not illustrated in FIG. 3, a mask pattern layer may be formed on the semiconductor substrate 100. The semiconductor substrate 100 may be selectively etched using the mask pattern layer to form the active regions 104, which may define a plurality of cell regions. Subsequently, a process of removing the mask pattern layer and a process of removing byproducts generated during the etching process that remain on the semiconductor substrate 100 are performed. The mask pattern layer may include, for example, a hard mask pattern layer, a photoresist pattern layer, or a combination thereof. For example, a dry etching process using plasma or ozone, or a wet etching process using an etching solution, may be applied to remove the mask pattern layer and to remove the byproducts.

Meanwhile, each of the trench isolation regions 10 may include a trench having a predetermined bottom width $W_{s1}$ and a predetermined height $H_{d1}$. Each of the active regions 104 may include a structure having a predetermined bottom width $W_{d1}$ and the predetermined height $H_{d1}$. Each of the active regions 104 may include a top surface 104a and a side wall 104b. As a critical dimension of the semiconductor manufacturing process is reduced, the aspect ratio of each of the active regions 104, which is the ratio of the bottom width $W_{s1}$ to the height $H_{d1}$, is increased.

Figure 4:
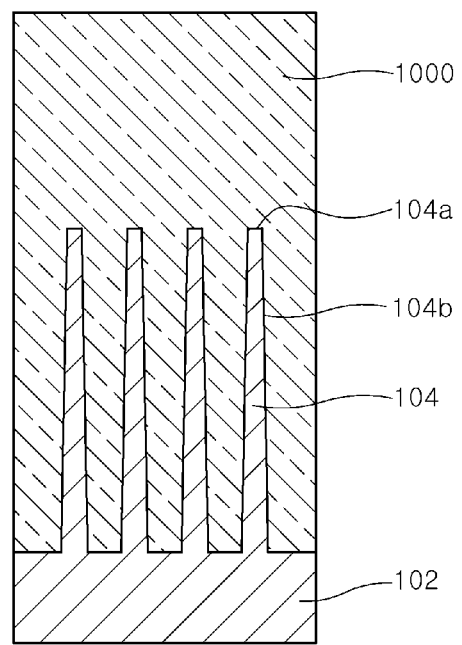

Referring to FIG. 4, deionized water 1000 is provided to the semiconductor substrate 100, and can be used to wash the semiconductor substrate 100. According to a specific embodiment, the washing process may be performed after removing the mask pattern layer and the byproducts of the etching process. At least one of a dry etching process and a wet etching process may be used to remove the mask pattern layer and the byproducts of the etching process.

For example, a method of spraying the deionized water 1000 onto the semiconductor substrate 100, or a method of immersing the semiconductor substrate 100 in a bath filled with the deionized water 1000, may be used to provide the deionized water 1000 to the semiconductor substrate 100.

Meanwhile, when the aspect ratio of the active regions 104 exceeds a predetermined critical value, the active regions 104 may collapse during the washing process. For example, when the bottom width $W_{d1}$ of each of the active regions 104 is 20 nm or less, and the aspect ratio is 6 or greater, the active regions 104 may collapse during the washing process. The active regions 104 may collapse when the deionized water 1000 is evaporated from the trench isolation regions 10 in the final stage of the washing process, because evaporating the deionized water 1000 causes a capillary force to be exerted on at least one pair of the active regions 104. The capillary force may cause neighboring active regions 104 to join with each other, or cause individual active regions 104 to fall down.

In an embodiment, instead of drying the deionized water 1000 after washing the semiconductor substrate 100 in which the active regions 104 and the trench isolation regions 10 are formed using the deionized water 1000, processes that will be described with reference to FIGS. 5 to 7 will be performed. The processes illustrated with reference to FIGS. 5 to 7 may effectively suppress the collapse of the active regions 104. Thus, the trench isolation regions 10, which may be filled with a material that structurally supports the active regions 104 and electrically isolates the active regions 104 from each other, can be formed easily.

Figure 5:
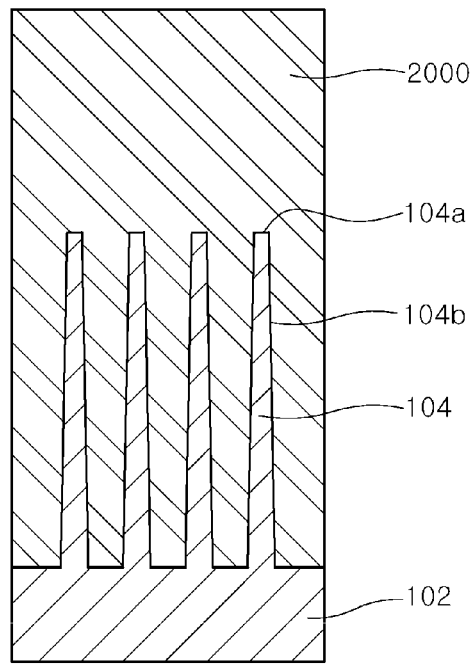

Referring to FIG. 5, a silicon-based solution 2000 is prepared. The silicon-based solution 2000 is provided to the semiconductor substrate 100, and the deionized water 1000 on the semiconductor substrate 100 is replaced with the silicon-based solution 2000.

In an embodiment, the silicon-based solution 2000 may be provided to the semiconductor substrate 100 when the deionized water 1000 at least partially fills the trench isolation regions 10 of the semiconductor substrate 100. In a specific embodiment, the silicon-based solution 2000 may be provided to the semiconductor substrate 100 by spraying the silicon-based solution 2000 on the semiconductor substrate 100 when the semiconductor substrate 100 is covered with the deionized water 1000, or immersing the semiconductor substrate 100 in a bath filled with the silicon-based solution 2000 when the semiconductor substrate 100 is covered with the deionized water 1000.

The silicon-based solution 2000 may include, for example, a solute containing silicon (Si). The silicon-based solution 2000 may further include an organic solvent or an inorganic solvent that dissolves the solute. The specific gravity of the silicon-based solution 2000 may be greater than the specific gravity of the deionized water 1000. Accordingly, the deionized water 1000 can be easily replaced with the silicon-based solution 2000 on the semiconductor substrate 100. In other words, when the silicon-based solution 2000 is provided on the deionized water 1000, the silicon-based solution 2000, which has a relatively great specific gravity, can move downward through the deionized water 1000 to contact the active regions 104 and the trench isolation regions 10, and the deionized water 1000, which has a relatively small specific gravity, can move above the silicon-based solution 2000. That is, due to the difference in the specific gravities of the deionized water 1000 and the silicon-based solution 2000, the silicon-based solution 2000 may spontaneously sink underneath the deionized water 1000 when the silicon-based solution 2000 is provided to the semiconductor substrate 100. The silicon-based solution 2000 may be disposed between the semiconductor substrate 100 and the deionized water 1000.

After replacing the deionized water 1000 with the silicon-based solution 2000 on the semiconductor substrate 100, the semiconductor substrate 100 may be dried to remove the deionized water 1000 of FIG. 4. In an embodiment, the semiconductor substrate 100 may be dried for 30 seconds to 5 minutes at a temperature of 100° C. to 300° C. When the deionized water 1000 is removed by the process of drying the semiconductor substrate 100, the silicon-based solution 2000 can remain in the trench isolation regions 10, such that the silicon-based solution 2000 fills the trench isolation regions 10. Accordingly, when the deionized water 1000 is removed, the above-described capillary force, exerted by the deionized water 1000, may not act on the active regions 104.

Figure 6:
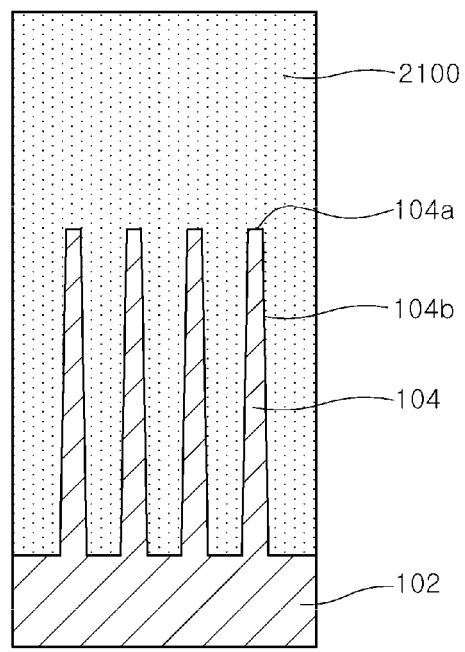

Referring to FIG. 6, a heat treatment is performed with respect to the semiconductor substrate 100 and the silicon-based solution 2000. The heat treatment may remove the solvent in the silicon-based solution 2000, and oxidize the solute containing silicon (Si). The heat treatment may thereby turn the solute into a silicon oxide material 2100. In an embodiment, the heat treatment may be performed in the presence of oxygen at a temperature of 700° C. to 800° C.

The silicon oxide material 2100 may be formed on the top surface 104a and on the side wall 104b of each of the active regions 104. In an embodiment, the silicon oxide material 2100 may be formed inside of the trench isolation regions 10. In another embodiment, the silicon oxide material 2100 may be formed to fill the trench isolation regions 10 and to cover the active regions 104. The silicon oxide material 2100 in the trench isolation regions 10 may structurally support the active regions 104.

Figure 7:
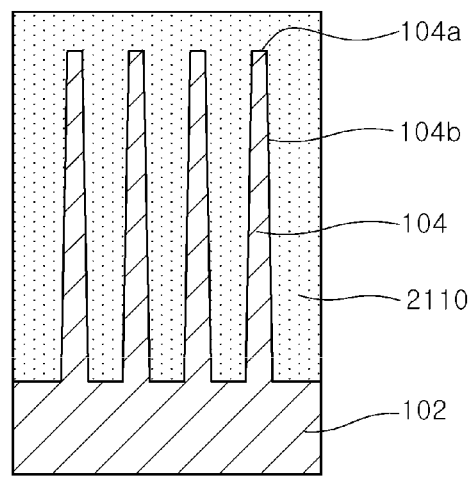

Referring to FIG. 7, a process of removing a predetermined thickness of the silicon oxide material 2100 may be performed. The process of removing the predetermined thickness of the silicon oxide material 2100 may be performed using, for example, an etch-back process or a chemical-mechanical polishing (CMP) process.

A device isolation layer 2110 electrically isolating the active regions 104 may be formed by removing the predetermined thickness of the silicon oxide material 2100 over the plurality of active regions 104. Although not illustrated in FIG. 7, an upper portion of the silicon oxide material 2100 of FIG. 6 may be removed to expose the top surface 104a of each of the active regions 104. The active regions 104, each having the exposed top surface 104a and being electrically isolated by the device isolation layer 2110, may form, for example, a plurality of active cell regions in the semiconductor substrate 100.

As described above, according to an embodiment of the present disclosure, a plurality of active regions and trench isolation regions are formed by selectively etching a semiconductor substrate. Subsequently, the semiconductor substrate is washed using deionized water. At this time, instead of removing the deionized water directly from the semiconductor substrate after the wash process, the deionized water is replaced with a silicon-based solution so that the silicon-based solution fills the trench isolation regions. Then, a heat treatment is applied to the semiconductor substrate and silicon-based solution to form a silicon oxide material from the silicon-based solution.

As described above, the deionized water, which remains on the semiconductor substrate after the wash process, is not removed directly from the semiconductor substrate. Therefore, it is possible to prevent a capillary force from acting on the active regions when the deionized water is removed. As a result, it is possible to prevent the active regions from collapsing due to a capillary force caused by evaporating the deionized water. In addition, embodiments of the present disclosure can be used to simultaneously prevent the collapse of the active regions and form the device isolation layer between the active regions, by applying a heat treatment to the silicon-based solution to form the silicon oxide material, which can function as the device isolation layer.

FIGS. 8 to 13 are cross-sectional views schematically illustrating a method of treating a semiconductor substrate according to an embodiment of the present disclosure. The method of treating a semiconductor substrate illustrated by FIGS. 8 to 13 may be used to form a capacitor structure in a DRAM cell or to form a cell structure of a resistive memory.

Figure 8:
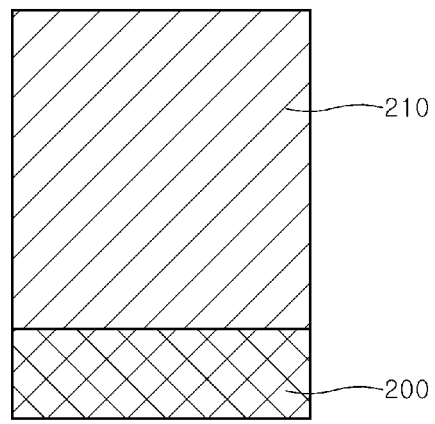
FIGS. 8 to 13 are cross-sectional views schematically illustrating a method of treating a semiconductor substrate according to an embodiment of the present disclosure.

Referring to FIG. 8, an etching object layer 210 may be stacked on a semiconductor substrate 200. The semiconductor substrate 200 may be formed of a material, such as silicon (Si), germanium (Ge), gallium arsenide (GaAs), or the like, but is not limited thereto. The semiconductor substrate 200 may be formed of any of various known materials capable of being processed by a semiconductor integrated circuit. An integrated circuit including multiple layers may be formed in the semiconductor substrate 200.

The etching object layer 210 may include a conductive layer, an insulation layer, or both. The etching object layer 210 may include at least one conductive layer and at least one insulation layer, which are stacked. The conductive layer may include, for example, a metal, a conductive metal nitride, or a conductive metal oxide. In a specific embodiment, the conductive layer may include copper (Cu), aluminum (Al), tungsten (W), titanium nitride (TiN), tantalum nitride (TaN), ruthenium (Ru), ruthenium oxide (RuO), or the like. The insulation layer may include, for example, silicon oxide, silicon nitride, or silicon oxy-nitride. The insulation layer may include, for another example, a metal oxide such as aluminum oxide, hafnium oxide, tantalum oxide, or the like. The metal oxide used for the insulation layer may have a metal content adjusted so that the metal oxide functions as an insulation material.

Figure 9:
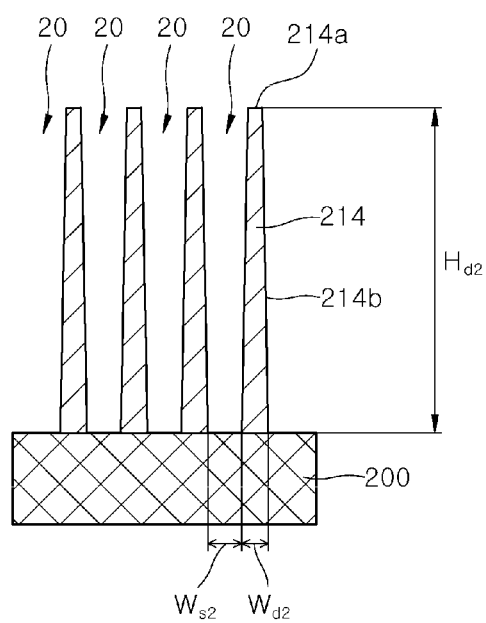

Referring to FIG. 9, a plurality of pattern structures 214 are formed on the semiconductor substrate 200 by selectively etching the etching object layer 210. The pattern structures 214 and the semiconductor substrate 200 may be collectively referred to as a "semiconductor structure." The plurality of pattern structures 214 may be spaced apart from each other. Each of the plurality of pattern structures 214 may, for example, be a pillar-shaped structure.

In a specific embodiment, the etching process for forming the plurality of pattern structures 214 may be performed as follows. Although not illustrated in FIG. 9, a mask pattern layer may be formed on the etching object layer 210. Then, the etching object layer 210 may be etched using the mask pattern layer to form the plurality of pillar-shaped pattern structures 214. At this time, trench isolation regions 20 are formed between the plurality of pattern structures 214. Next, a process of removing the mask pattern layer, and a process of removing byproducts, which are generated in the etching process and remain on the semiconductor substrate 200, are performed. The mask pattern layer may include, for example, a hard mask pattern layer, a photoresist pattern layer, or a combination thereof. The processes of removing the mask pattern layer and removing the byproducts may include at least one of a dry etching process using plasma or ozone, and a wet etching process using an etching solution.

Each of the pattern structures 214 may have a predetermined bottom width $W_{d2}$ and a predetermined height $H_{d2}$, and each of the trench isolation regions 20 may include a trench having a predetermined bottom width $W_{s2}$ and the height $H_{d2}$. Each of the pattern structures 214 may have a top surface 214a and a side wall 214b. As a critical dimension of the semiconductor manufacturing process is reduced, the aspect ratio of the pattern structure 214, which is the ratio of the bottom width $W_{d2}$ to the height $H_{d2}$, increases.

Figure 10:
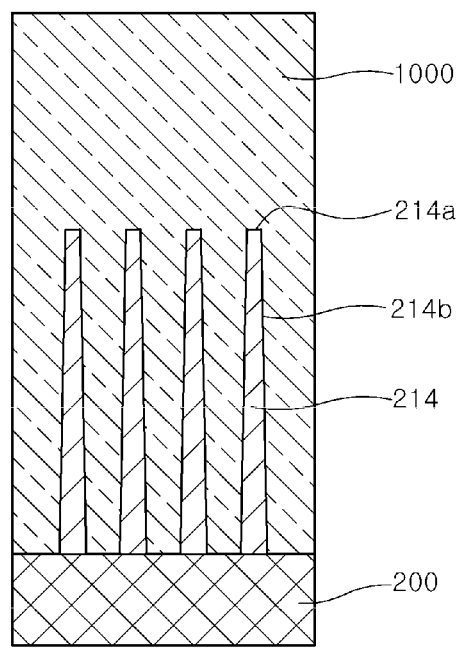

Referring to FIG. 10, deionized water 1000 may be provided to the semiconductor substrate 200, on which the plurality of pattern structures 214 are formed, to wash the semiconductor substrate 200. In a specific embodiment, the washing process may be performed after removing the mask pattern layer and byproducts. The washing process may include using at least one of a dry etching process and a wet etching process.

The deionized water 1000 may be provided to the semiconductor substrate 200 using, for example, a method of spraying the deionized water 1000 on the semiconductor substrate 200, a method of immersing the semiconductor substrate 200 in a bath filled with the deionized water 1000, or the like.

When the aspect ratio of the plurality of pattern structures 214 exceeds a predetermined critical value, the pattern structures 214 may collapse during the washing process. As described with reference to FIGS. 2 to 7, such a collapse of the pattern structures 214 may occur when the deionized water 1000 provided to the semiconductor substrate 200 is evaporated, while being dried and removed, and exerts a capillary force on at least one pair of the pattern structures 214. The collapse may occur due to the capillary force, which causes the neighboring pattern structures 214 to adhere to each other or individual pattern structures 214 to fall down.

In an embodiment of the present disclosure, instead of immediately performing the process of removing the deionized water after washing the semiconductor substrate 200, processes, which will be described with reference to FIGS. 11 to 13, may be performed.

Figure 11:
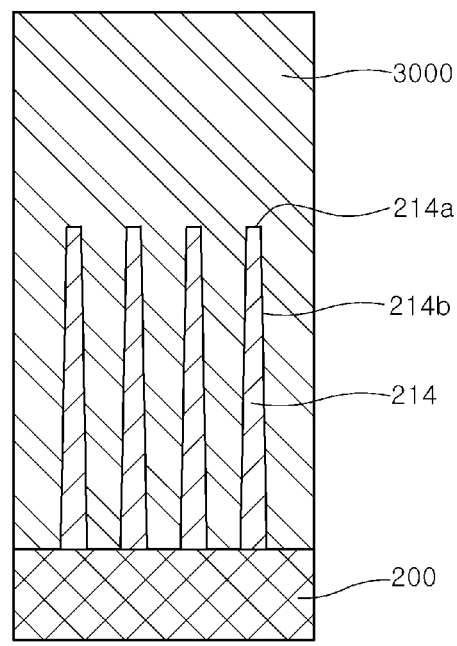

Referring to FIG. 11, an insulation treatment solution 3000 is prepared. The insulation treatment solution 3000 is provided to the semiconductor substrate 200, and the deionized water 1000 is replaced with the insulation treatment solution 3000, such that the insulation treatment solution 3000 is disposed on the semiconductor substrate 200. The insulation treatment solution 3000 may be directly disposed on the semiconductor substrate 200 and the pattern structures 214.

In an embodiment, the insulation treatment solution 3000 may be provided to the semiconductor substrate 200 when the deionized water 1000 fills the trench isolation regions 20 of the semiconductor substrate 200. In a specific embodiment, the insulation treatment solution 3000 may be provided by spraying the insulation treatment solution 3000 to the semiconductor substrate 200 covered with the deionized water 1000, or immersing the semiconductor substrate 200 covered with the deionized water 1000 in a bath filled with the insulation treatment solution 3000.

The insulation treatment solution 3000 may include a solute that can be oxidized. The insulation treatment solution 3000 may further include an organic solvent or an inorganic solvent that dissolves the solute. For example, the insulation treatment solution 3000 may be a silicon-based solution, and the solute may include silicon. The specific gravity of the insulation treatment solution 3000 may be greater than the specific gravity of the deionized water 1000. The deionized water 1000 may be replaced with the insulation treatment solution 3000 using the difference between the specific gravity of the insulation treatment solution 3000 and the specific gravity of the deionized water 1000. The insulation treatment solution 3000, which has a relatively great specific gravity, can move to the bottom of the deionized water 1000, and the deionized water 1000, which has a relatively small specific gravity, can move to the top of the insulation treatment solution 3000, such that the deionized water 1000 can be easily replaced with the insulation treatment solution 3000 on the semiconductor substrate 200. That is, the insulation treatment solution 3000 sinks underneath the deionized water 1000, such that the insulation treatment 3000 is disposed between the deionized water 1000 and the semiconductor substrate 200. As a result, the insulation treatment solution 3000 can be in contact with the plurality of pattern structures 214 in place of the deionized water 1000.

After replacing the deionized water 1000 on the semiconductor substrate 200 with the insulation treatment solution 3000, the semiconductor substrate 200 may be dried to remove the deionized water 1000. In an embodiment, the semiconductor substrate 200 may be dried for 30 seconds to 5 minutes at a temperature of 100° C. to 300° C. When the deionized water 1000 is removed from the semiconductor substrate 200, the insulation treatment solution 3000 can fill the trench isolation regions 20 instead of the deionized water 1000. Accordingly, when the deionized water 1000 is removed, the above-described capillary force may not act on the pattern structures 214 and may not cause the pattern structures 214 to collapse.

Figure 12:
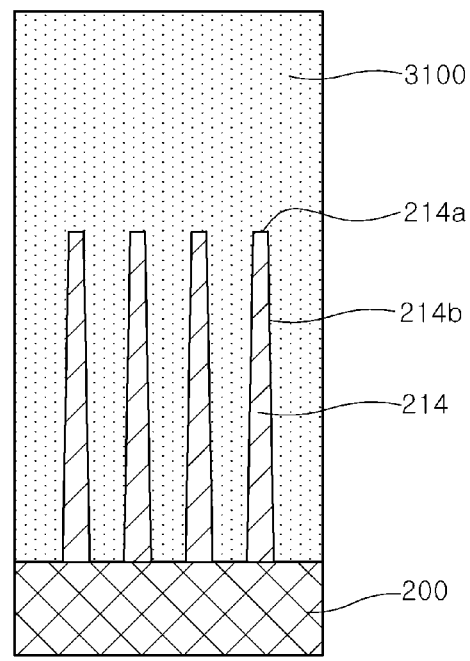
Figure 13:
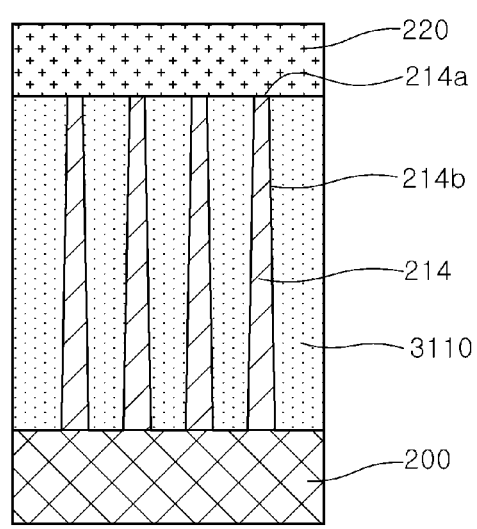

Referring to FIG. 12, a heat treatment is performed on the semiconductor substrate 200. In an embodiment, the heat treatment may be performed in the presence of oxygen at a temperature of 700° C. to 800° C. The heat treatment may remove the solvent in the insulation treatment solution 3000 and oxidize the solute in the insulation treatment solution 3000, and therefore, form an insulation material layer 3100. The insulation material layer 3100 may include a silicon oxide material or a metal oxide material according to the kind of the solute in the insulation treatment solution 3000.

The insulation material layer 3100 may be formed on the top surface 214a and on the side wall 214b of each of the pattern structures 214. In an embodiment, the insulation material layer 3100 may be formed inside of the trench isolation regions 20. The insulation material layer 3100 may fill the trench isolation regions 20 and may cover the pattern structures 214. Unlike the embodiment illustrated in FIG. 12, the insulation material layer 3100 may partially fill the trench isolation regions 20 while being formed along the top surface 214a and the side wall 214b. The insulation material layer 3100 may structurally support the pattern structures 214.

By performing the above described processes, the method of treating a semiconductor substrate according to an embodiment of the present disclosure can be implemented.

In an embodiment, a process, which will be described with reference with FIG. 13, may be additionally performed. Referring to FIG. 13, a predetermined thickness of the insulation material layer 3100 is removed to expose the top surface 214a of each of the plurality of pattern structures 214. As a result, an insulation material layer 3110, which electrically isolates the plurality of pattern structures 214, may be formed.

The process of removing the predetermined thickness of the insulation material layer 3100 may be performed using, for example, an etch-back process or a chemical-mechanical polishing (CMP) process. The process of removing the predetermined thickness of the insulation material layer 3100 may include performing a planarization process on the top surface 214a of the pattern structure 214, and the top surface of the insulation material layer 3100.

Next, a thin layer 220 may be formed over the pattern structures 214. The thin layer 220 may include an insulation layer or a conductive layer. When the plurality of pattern structures 214 include various electric devices, the thin layer 220 may include a wiring layer that is electrically connected to the electric devices.

As described above with reference to FIGS. 8 to 13, an etching object layer on a semiconductor substrate may be selectively etched to form a plurality of pattern structures. The plurality of pattern structures may be washed with deionized water. Instead of removing the deionized water directly from the semiconductor substrate after the wash process, the deionized water may be replaced with an insulation treatment solution, such that the insulation treatment solution covers the plurality of pattern structures. Then, the semiconductor substrate and the insulation treatment solution are heat-treated to form an insulation material between the plurality of pattern structures.

As described above, the deionized water remaining on the semiconductor substrate after the wash process is not removed directly from the semiconductor substrate. Therefore, it is possible to suppress a capillary force, and to prevent the capillary force from acting on the plurality of pattern structures during the process of removing the deionized water. As a result, it is possible to prevent the plurality of pattern structures from collapsing. In addition, embodiments of the present disclosure can be used to simultaneously prevent the collapse of the plurality of pattern structures, and to easily form the insulation layer between the plurality of pattern structures, by applying heat treatment to the insulation treatment solution. The insulation layer may electrically isolate the plurality of pattern structures from each other.

Embodiments of the inventive concept have been disclosed above for illustrative purposes. Those of ordinary skill in the art will appreciate that various modifications, additions, and substitutions are possible, without departing from the scope and spirit of the inventive concept as disclosed in the accompanying claims.

What is claimed is:

1. A method of treating a semiconductor substrate, the method comprising:
    forming a plurality of active regions and a plurality of trench isolation regions by selectively etching a semiconductor substrate, the plurality of active regions being formed in the semiconductor substrate, the plurality of trench isolation regions being formed between the plurality of active regions;
    washing the semiconductor substrate by providing deionized water to the semiconductor substrate, the provided deionized water being disposed on the semiconductor substrate;
    providing a silicon-based solution to the semiconductor substrate by replacing the deionized water disposed on the semiconductor substrate with the silicon-based solution, the silicon-based solution covering the plurality of active regions and filling the plurality of trench isolation regions;
    removing the deionized water from the semiconductor substrate by drying the semiconductor substrate at a first temperature while the silicon-based solution remains in a solution state; and
    forming a silicon oxide material from the silicon-based solution by performing a heat treatment on the silicon-based solution and the semiconductor substrate, at a second temperature that is higher than the first temperature,
    wherein the silicon oxide material fills the plurality of trench isolation regions.

2. The method of claim 1, wherein providing the deionized water to the semiconductor substrate comprises spraying the deionized water on the semiconductor substrate or immersing the semiconductor substrate in a bath that includes the deionized water.

3. The method of claim 1, further comprising:
removing byproducts disposed on the semiconductor substrate by performing at least one of a dry etching process and a wet etching process on the semiconductor substrate, the byproducts being removed before washing the semiconductor substrate.

4. The method of claim 1, wherein the silicon-based solution is provided when the deionized water fills the plurality of trench isolation regions.

5. The method of claim 1, wherein the silicon-based solution comprises a solute containing silicon.

6. The method of claim 1, wherein a specific gravity of the silicon-based solution is greater than a specific gravity of the deionized water.

7. The method of claim 6, wherein the silicon-based solution spontaneously sinks into the trench isolation regions under the deionized water when the silicon-based solution is provided.

8. The method of claim 1, wherein drying the semiconductor substrate is performed for 30 seconds to 5 minutes at a temperature of 100° C. to 300° C.

9. The method of claim 1, wherein the heat treatment with respect to the semiconductor substrate is performed in the presence of oxygen at a temperature of 700° C. to 800° C.

10. The method of claim 1, further comprising:
forming a device isolation layer by removing a portion of the silicon oxide material, the portion being disposed over the plurality of active regions, the device isolation layer electrically isolating the plurality of active regions from each other.

11. A method, comprising:
washing a semiconductor structure by providing deionized water to the semiconductor structure, the semiconductor structure including a semiconductor substrate and a plurality of pattern structures, the plurality of pattern structures being spaced apart from each other;
providing an insulation treatment solution to the semiconductor structure by replacing the deionized water provided to the semiconductor structure with the insulation treatment solution;
removing the deionized water from the semiconductor structure by drying the semiconductor structure at a first temperature while the insulation treatment solution remains in a solution state; and
forming an insulation material from the insulation treatment solution by performing a heat treatment on the insulation treatment solution and the semiconductor structure at a second temperature that is higher than the first temperature,
wherein the insulation material is formed over the plurality of pattern structures.

12. The method of claim 11, wherein the plurality of pattern structures are pillar-shaped structures formed on the semiconductor substrate.

13. The method of claim 11, further comprising:
removing byproducts disposed on the semiconductor substrate by performing at least one of a dry etching process and a wet etching process on the semiconductor substrate, the byproducts being removed before the semiconductor structure is washed.

14. The method of claim 11,
wherein providing the deionized water to the semiconductor structure includes filling a space between the plurality of pattern structures with the deionized water, and
wherein providing the insulation treatment solution to the semiconductor structure includes filling the space between the plurality of pattern structures with the insulation treatment solution.

15. The method of claim 11, wherein the insulation treatment solution includes a solvent and a solute, and
wherein performing the heat treatment on the insulation treatment solution and the semiconductor structure comprises:
removing the solvent from the insulation treatment solution; and
oxidizing the solute in the insulation treatment solution.

16. The method of claim 11, wherein the insulation treatment solution comprises a solute including silicon or a metal that can be oxidized.

17. The method of claim 11, wherein a specific gravity of the insulation treatment solution is greater than a specific gravity of the deionized water.

18. The method of claim 11, wherein the heat treatment is performed in the presence of oxygen at a temperature of 700° C. to 800° C.

* * * * *